US010512151B2

(12) United States Patent
Lin

(10) Patent No.: US 10,512,151 B2
(45) Date of Patent: Dec. 17, 2019

(54) ELECTRONIC DEVICE WITH SELF-REGULATED COOLING TO AVOID HOT-SPOT HEATING

(71) Applicant: NANNING FUGUI PRECISION INDUSTRIAL CO., LTD., Nanning (CN)

(72) Inventor: Meng-Nan Lin, New Taipei (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 139 days.

(21) Appl. No.: 15/881,436

(22) Filed: Jan. 26, 2018

(65) Prior Publication Data

US 2019/0239336 A1 Aug. 1, 2019

(51) Int. Cl.
*H05K 1/02* (2006.01)
*H05K 1/18* (2006.01)
(Continued)

(52) U.S. Cl.
CPC ........... *H05K 1/0203* (2013.01); *H01L 23/34* (2013.01); *H05K 1/18* (2013.01); *H05K 5/03* (2013.01);
(Continued)

(58) Field of Classification Search
CPC ....... G06F 1/181–182; H05K 7/20218–20381; H05K 7/20409–20418; H05K 7/20009–202; H05K 1/0203; H05K 1/18; H05K 5/03; H05K 7/14; H05K 2201/10151; H01L 23/367–3677; H01L 23/473; H01L 23/46–467
See application file for complete search history.

(56) References Cited

U.S. PATENT DOCUMENTS

| 2008/0298011 | A1* | 12/2008 | Hongo | ..................... G06F 1/203 |
| | | | | 361/679.54 |
| 2015/0228411 | A1* | 8/2015 | Owen | ..................... H01G 4/38 |
| | | | | 310/68 R |
| 2018/0217006 | A1* | 8/2018 | Choi | ..................... G01K 7/223 |

FOREIGN PATENT DOCUMENTS

| CN | 105472942 A | 4/2016 |
| CN | 105592338 A | 5/2016 |

(Continued)

*Primary Examiner* — Jayprakash N Gandhi
*Assistant Examiner* — Razmeen Gafur
(74) *Attorney, Agent, or Firm* — ScienBiziP, P.C.

(57) ABSTRACT

An electronic device able to regulate its own working temperature and keep the same constant notwithstanding light or heavy processor activity includes a shell, a circuit board mounted on the shell, a control module and a heating element mounted on the circuit board, and a heat dissipation assembly. The connecting assembly includes a first heat dissipation component, a second heat dissipation component, and a connecting assembly. The first heat dissipation component includes a first heat-conducting board, an elastic component, and a second magnetic component. The second heat dissipation component includes a second support with a second heat-conducting board rotatably mounted. The connecting assembly rotatably connects the first support and the second support and brings the heat dissipation components together for high-temperature heat dissipation and separates same when low working heat is generated. The electronic device dissipates heat evenly through the heat dissipation assembly.

17 Claims, 8 Drawing Sheets

(51) Int. Cl.
*H05K 7/14* (2006.01)
*H05K 5/03* (2006.01)
*H05K 7/20* (2006.01)
*H01L 23/34* (2006.01)

(52) U.S. Cl.
CPC ........... *H05K 7/14* (2013.01); *H05K 7/20127* (2013.01); *H05K 7/20209* (2013.01); *H05K 2201/10151* (2013.01)

(56) References Cited

FOREIGN PATENT DOCUMENTS

| TW | 1547234 | 8/2016 |
| TW | M528576 | 9/2016 |

* cited by examiner

100

ELECTRONIC DEVICE WITH SELF-REGULATED COOLING TO AVOID HOT-SPOT HEATING

FIELD

The subject matter herein generally relates to the field of electronic products heat dissipation technology, and more particularly to an electronic device.

BACKGROUND

When an electronic product is operating, an internal hardware of the electronic product generates a large amount of heat, which increases internal temperature of the electronic product. Thus affects a normal operation of the hardware. Therefore, the heat generated by the hardware needs to be dissipated out of the electronic product in time to reduce the internal temperature of the electronic product.

At present, an electronic product can define a plurality of heat dissipation holes to reduce the internal temperature. To deal with a high total wattage of the electronic product, heat dissipation holes are located on the top region of a case of the electronic product to meet an overall heat dissipation requirement. A main chip of the electronic product is usually located at a center of the electronic product, which results in a heat concentration at a center of the case. The temperature at the center of the case is significantly higher than the sides, and an overall temperature of the case is not balanced.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. It will be appreciated that for simplicity and clarity of illustration, where appropriate, reference numerals have been repeated among the different figures to indicate corresponding or analogous elements.

DETAILED DESCRIPTION

Figure 1:
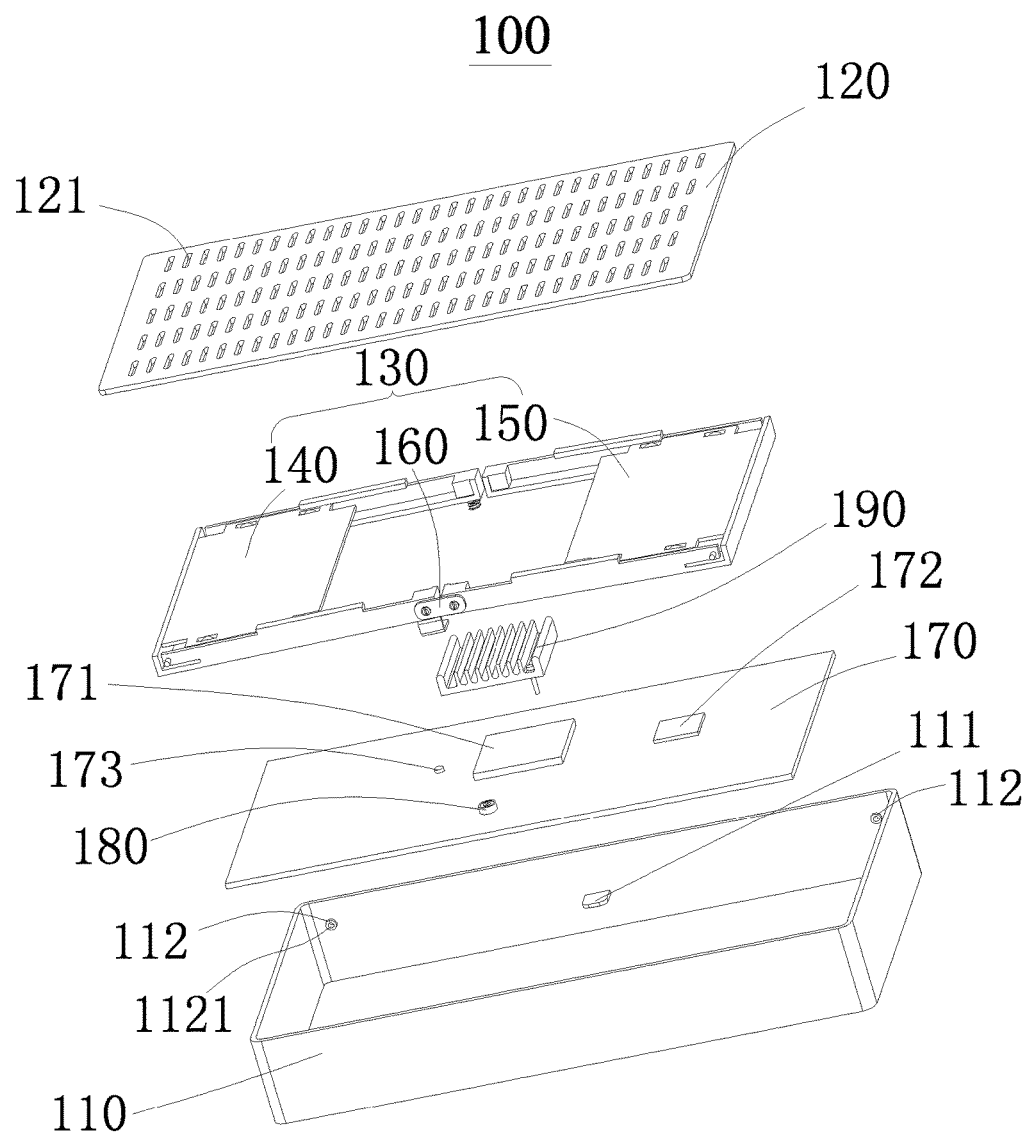
FIG. 1 shows an exploded perspective view of an exemplary embodiment of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "inside" indicates that at least a portion of a region is partially contained within a boundary formed by the object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like.

FIG. 1 shows an exemplary embodiment of an electronic device 100. As shown in FIG. 1, the electronic device 100 includes a housing. The housing includes a bottom shell 110 and a top cover 120. The bottom shell 110 and the top cover 120 are fastened with each other to form a receiving space. The electronic device 100 further includes a heat dissipation assembly 130, a circuit board 170, a first magnetic component 180, and a heat sink 190 received in the receiving space. The heat dissipation assembly 130 includes heat dissipation components 140 and 150, and a connecting assembly 160 movably connected to the heat dissipation components 140 and 150. The first magnetic component 180 is mounted on the circuit board 170. The circuit board 170 includes a heating element 171, a control module 172, and a temperature sensor 173. The first magnetic component 180 is electrically connected to the control module 172. The temperature sensor 173 is adjacent to the heating element 171 and electrically connected to the control module 172.

In the exemplary embodiment, the electronic device 100 is a set-top box or a router. The heating element 171 is a central processing unit. The first magnetic component 180 is an electromagnet. The temperature sensor 173 is used to monitor a temperature information around the heating element 171 and transmit the temperature information to the control module 172. The control module 172 determines, according to the temperature information, that the heating element 171 is at a low load or a high load, and controls the power-off or power-on of the first magnetic component 180.

In other embodiments, the temperature sensor 173 can be integrated within the heating element 171. The temperature sensor 173 monitors an internal temperature of the heating element 171 and transmits the internal temperature information of the heating element 171 to the control module 172.

Referring to FIG. 1, the bottom shell 110 is a hollow rectangular parallelepiped structure, and has an opening. The bottom shell 110 has two opposite inner sidewalls, a supporting portion 111 and a plurality of fixing portions 112. The plurality of fixing portions 112 is symmetrically disposed on the inner sidewalls of the bottom shell 110. Each of the fixing portions 112 has a shaft hole 1121.

In the exemplary embodiment, the bottom shell 110 has four fixing portions 112. The support portion 111 is a thin plate protruding from one of the inner sidewalls of the bottom shell 110. The fixing portion 112 is a cylindrical protrusion from the inner sidewalls of the bottom shell 110. The top cover 120 is a long thin plate. Heat dissipation holes 121 are uniformly distributed on the top cover 120. The bottom shell 110 and the top cover 120 can be fastened together by screws.

Figure 2:
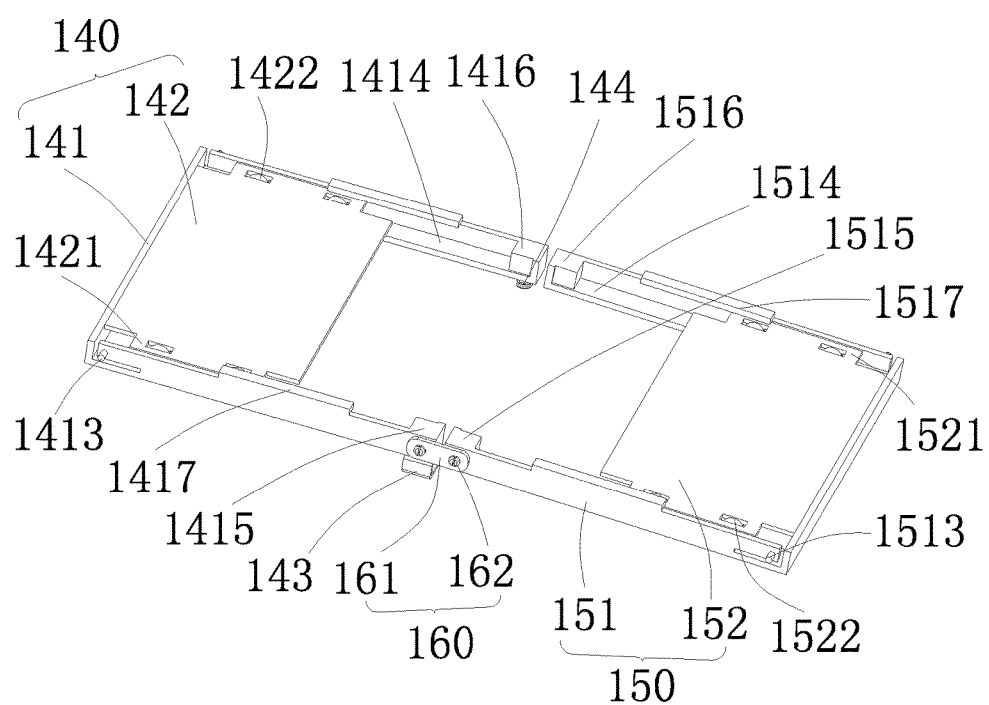
FIG. 2 shows a perspective view of an exemplary embodiment of a cooling assembly in the device shown in FIG. 1.
Figure 3:
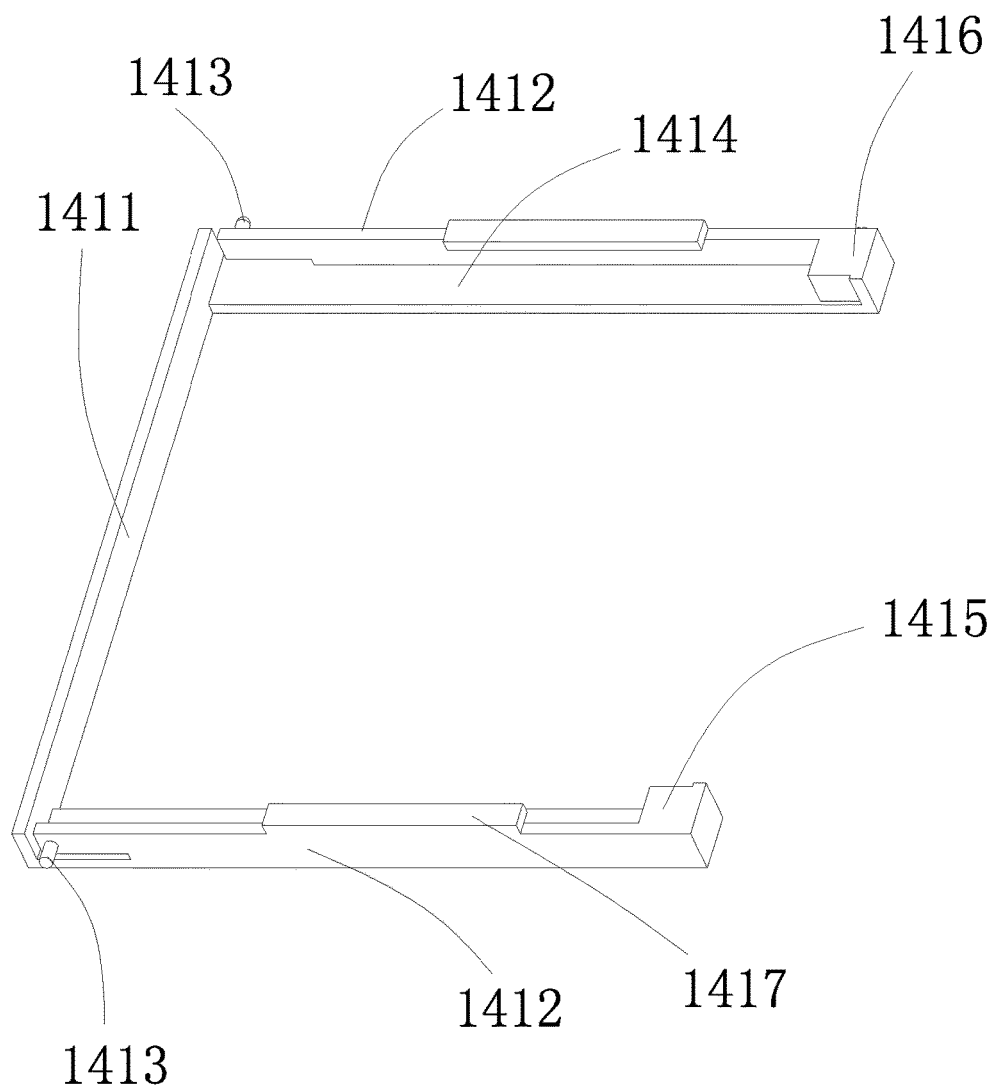
FIG. 3 shows a perspective view of an exemplary embodiment of a first support of the cooling assembly shown in FIG. 2.
Figure 4:
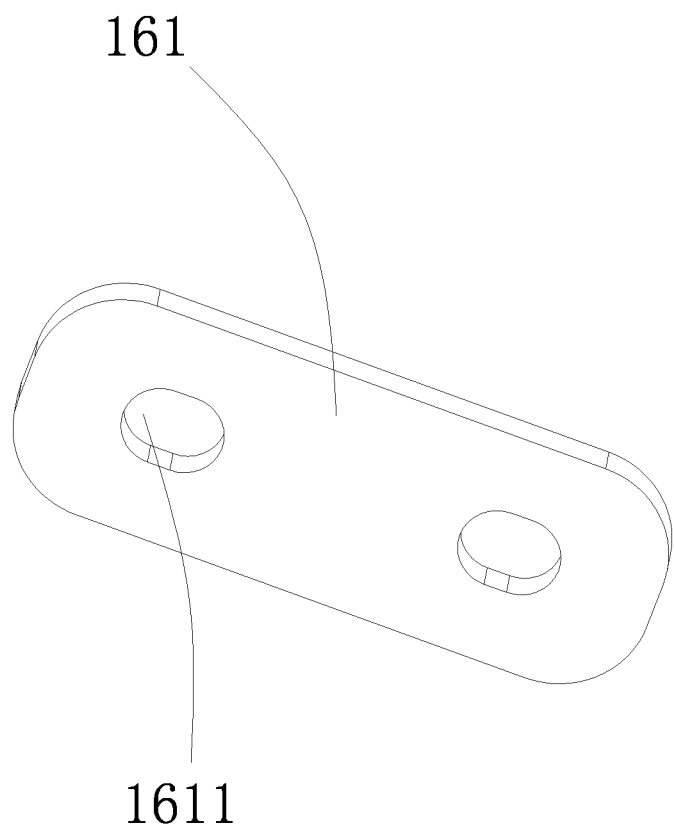
FIG. 4 is shows a perspective view of an exemplary embodiment of a connecting component of the cooling assembly shown in FIG. 2.

Referring to FIGS. 2, 3, and 4, the heat dissipation component 140 includes a support 141 and a heat-conducting board 142. The support 141 includes a connecting board 1411 and two supporting blocks 1412 extending from two sides of the connecting board 1411. The connecting board 1411 is a rectangular thin board. Each of the supporting blocks 1412 has a rotating portion 1413, sliding rail 1414, stopping portions 1415, 1416 and a stopping board 1417. The rotating portion 1413 is outside the supporting block 1412 and close to the connecting board 1411. The support 141 rotatably connects to the bottom shell 110 through the engagement of the rotating portion 1413 and the shaft hole 1121 of the fixing portion 112. The stopping portions 1415 and 1416 are each located at one end of a supporting block 1412, and away from the connecting board 1411. One sliding rail 1414 of the supporting blocks 1412 is disposed between the connecting board 1411 and the stopping portion 1415. The other sliding rail 1414 of supporting block 1412 is disposed between the connecting board 1411 and the stopping portion 1416. The stopping board 1417 is disposed in the middle of the supporting block 1412, and protrudes from the supporting block 1412 as far as the top of the sliding rail 1414. The blocking portion 1415 carries a second magnetic component 143. The blocking portion 1416 has an elastic component 144.

In the exemplary embodiment, the second magnetic component 143 is a magnetic metal foil. The elastic component 144 is a spring. The rotating portion 1413 is a rotating shaft. The stopping boards 1417 protrude upward from the supporting block 1412 and extend to the top of the sliding rails 1414. In other embodiments, the stopping board 1417 and the supporting block 1412 can be detachably connected by a fastener.

The heat-conducting board 142 is a heat conducting thin board, and has two protrusions 1421. Two wheels 1422 are mounted on each of the protrusions 1421. The heat-conducting board 142 is slidably mounted on the bracket 141 through the engagement of the wheels 1422 and the sliding rails 1414. The stopping board 1417 of the support 141 engages with the protrusion 1421 of the heat-conducting board 142 to limit the movement of the heat-conducting board 142, so as to prevent the heat-conducting board 142 from being detached from the support 141. The connecting board 1411, and the stopping portions 1415 and 1416 of the support 141 engage with each other to limit the sliding travel of the heat-conducting board 142.

The structure of the heat dissipation component 150 is substantially the same as that of the heat dissipation component 140.

Referring to FIG. 4, the connecting assembly 160 includes a connecting component 161 and two fasteners 162. The connecting component 161 is substantially in a shape of a sheet, and has two oval-shaped socket holes 1611. After the fasteners 162 and the socket holes 1611 are sleeved on each other, there is a clearance fit between the fastener 162 and the socket holes 1611. The fasteners 162 and the connecting component 161 can move relative to each other. In the exemplary embodiment, the fasteners 162 are screws.

When assembling the heat dissipation components 140 and 150 to form the heat dissipation assembly 130, first, the fasteners 162 are passed through the socket holes 1611 of the connecting component 161. One part of each fasteners 162 is fixed to the stopping portion 1415 of the support 141 and to the stopping portion 1515 of the support 151. The other part of each fastener 162 is movably sleeved with the socket holes 1611. Therefore, the stopping portion 1415 and the stopping portion 1515 are movable in relation to the other, so that the heat dissipation components 140 and 150 are movably connected.

The installing of components and working process of the electronic device 100 is described with reference to FIGS. 1-8.

Figure 5:
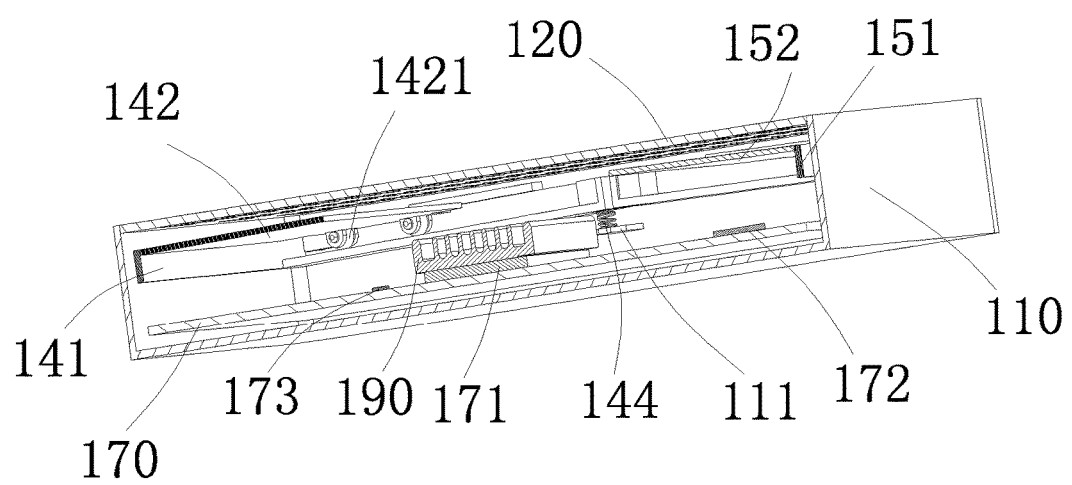
FIG. 5 shows a schematic cross-sectional view of the electronic device of FIG. 1 after assembly.
Figure 6:
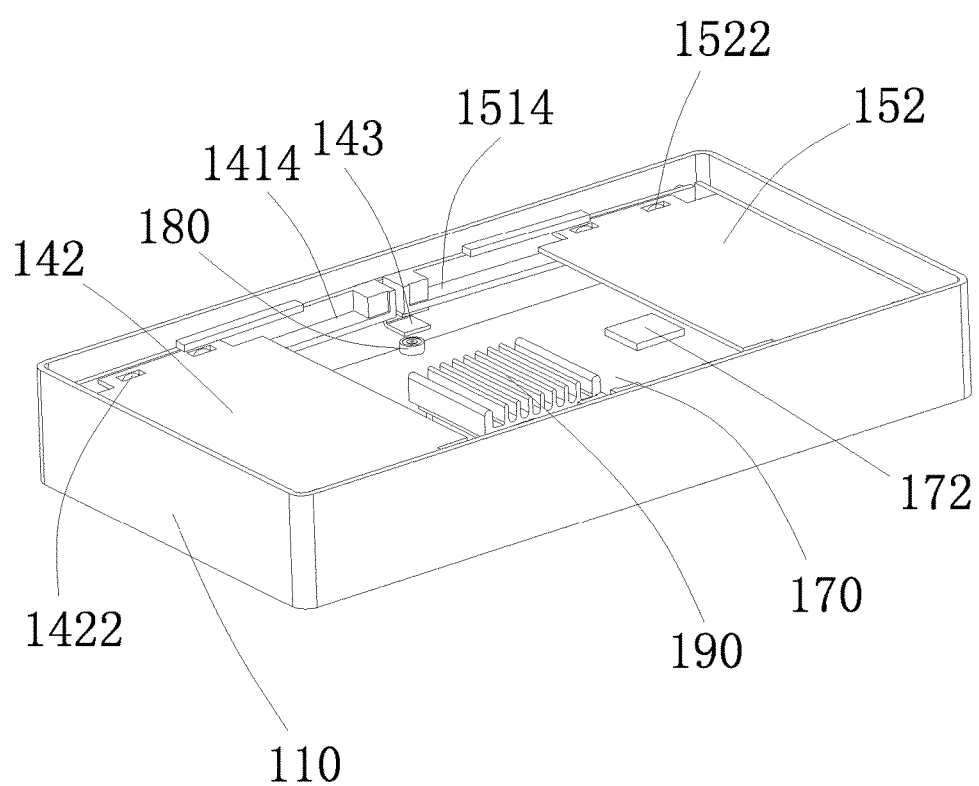
FIG. 6 shows a perspective view of the electronic device of FIG. 1 assembled, but with the cover removed.
Figure 7:
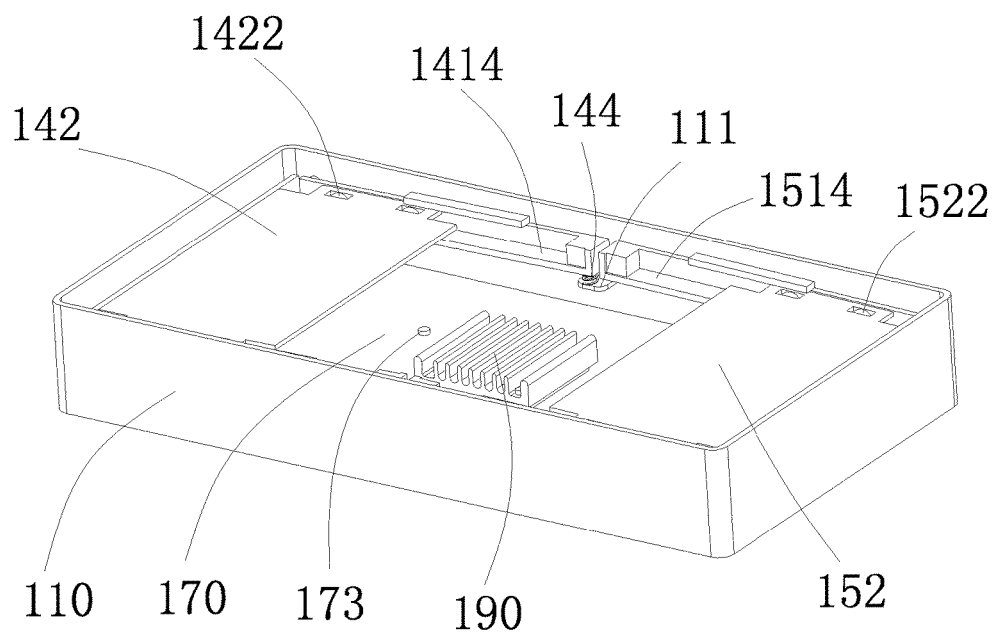
FIG. 7 shows another view of the items of FIG. 6.

When the components of the electronic device 100 are installed, firstly, the circuit board 170 is mounted on the bottom of the bottom shell 110. Secondly, the rotating portions 1413 and 1513 of the heat dissipation assembly 130 are installed in the shaft holes 1121 of the bottom shell 110. The supports 141 and 151 are rotatably mounted on the inner sidewalls of the bottom shell 110, so that the heat dissipation components 140 and 150 of the heat dissipation assembly 130 are rotatably mounted on the bottom shell 110. As shown in FIG. 5 to FIG. 7, the elastic component 144 abuts against the supporting portion 111 of the bottom shell 110, and the second magnetic component 143 faces the first magnetic component 180 mounted on the circuit board 170. Finally, the top cover 120 is placed and fixed to the bottom shell 110.

In other embodiments, the supporting portion 111 is absent from the bottom shell 110. When the heat dissipation assembly 130 is mounted on the bottom shell 110, the elastic component 144 abuts the circuit board 170.

When the electronic device 100 is in operation, the temperature sensor 173 monitors a temperature around the heating element 171 in real time, and transmits such information to the control module 172. When the temperature information is lower than the temperature set by the control module 172, the control module 172 determines that the heating element 171 is in the low-load operation state and de-energizes the first magnetic component 180. Thus the second magnetic component 143 is not attracted to the first magnetic component 180 due to absence of magnetic force. The elastic component 144 presses on the stopping portion 1416 of the heat dissipation component 140, so that the stopping portions 1415 and 1416 are higher than the rotating portions 1413. The stopping portion 1415 lifts the stopping portions 1515 and 1516 of the heat dissipation component 150 through the connecting assembly 160, so that the stopping portions 1515 and 1516 are higher than the rotating portions 1513 too. Thus, the heat-conducting boards 142 and 143 slide away from the stopping portions 1415 and 1515, so that the heating element 171 and the heat sink 190 are exposed. The heat generated by the heating element 171 is first conducted through the heat sink 190, and then dissipated to the outside of the electronic device 100 through the heat dissipation holes 121 of the top cover 120.

When the temperature of the heating element 171 is higher than the temperature set by the control module 172, the control module 172 determines that the heating element 171 is in a high-load working state and energizes the first magnetic component 180. The first magnetic component 180 attracts the second magnetic component 143, so that the second magnetic component 143 directly drives the support 141 to move toward the circuit board 170. The support 141 indirectly drives the support 151 toward the circuit board 170 through the connecting assembly 160. The heat-conducting board 142 slides along the sliding rails 1414 toward the stopping portions 1415 and 1416 through the wheels 1422. At the same time, the heat-conducting board 152 also slides along the sliding rails 1514 toward the stopping portions 1515 and 1516, through the wheels 1522. The protrusion 1421 limits the stopping boards 1417, thus the heat-conducting board 142 cannot be separated from the sliding rails 1414. Similarly, due to the limitation of the protrusion 1521 by the stopping boards 1517, the heat-conducting board 152 cannot be separated from the sliding rails 1514 by oversliding.

Figure 8:
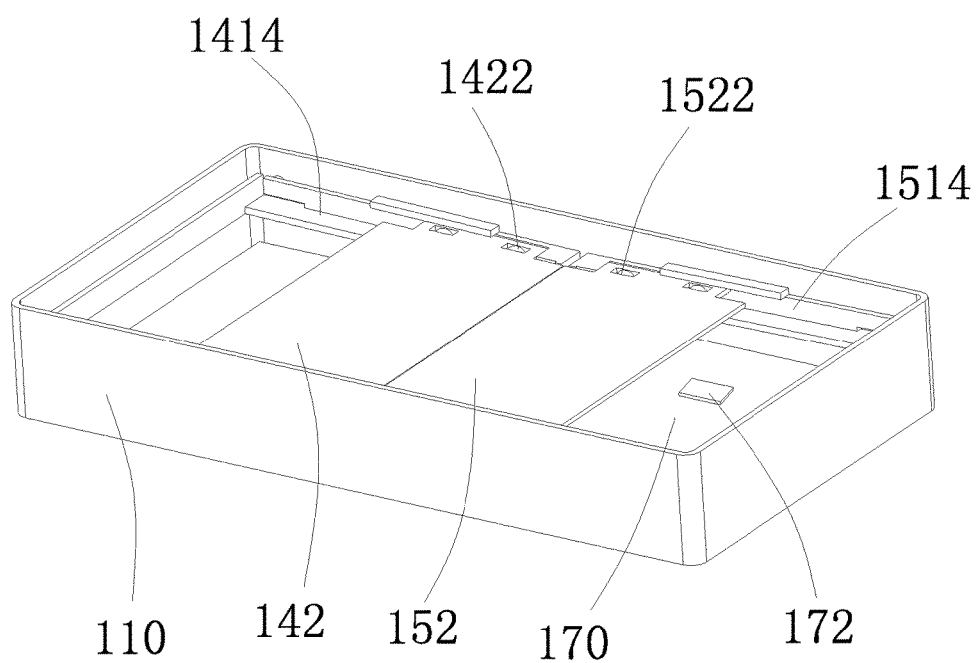
FIG. 8 shows a perspective view of a first thermal plate and a second thermal plate of the device shown in FIG. 1, in a closed state.

Finally, as shown in FIG. 8, the heat-conducting boards 142 and 152 become close to each other to cover the heating element 171 and the heat sink 190. The heat generated by the heating element 171 is first conducted through the heat sink 190, and then uniformly conducted by the heat-conducting boards 142 and 152 to evenly dissipate the heat to the top cover 120. The heat is dissipated to outside of the electronic device 100 through the heat dissipation holes 121 of the top cover 120. This prevents the temperature of the top cover 110 from being locally too high due to a concentration of heat.

It can be seen that the electronic device 100 provided by the disclosure monitors the temperature of the heating element 171 through the temperature sensor 173. The control module 172 energizes or de-energizes the first magnetic member 180 according to the temperature of the heating element 173, so that the heat-conducting boards 142 and 152 are closed together or separated from each other. When the heat-conducting boards 142 and 152 are brought together, the heat dissipated by the heating member 173 is uniformly conducted to the top cover 120 through the heat-conducting boards 142 and 152. The temperature of the surface of the top cover 120 remains substantially constant, so as to prevent the local temperature of the top cover 120 from being excessively high, thereby improving efficiency and avoiding heat-ageing. The heat dissipation assembly 130 of the electronic device 100 has a simple structure and a good heat dissipating effect. The electronic device 100 saves time and labor by automating temperature monitoring and heat dissipation.

The exemplary embodiments shown and described above are only examples.

Many details are often found in the art such as the features of sensor and monitoring system thereof. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. An electronic device, comprising:
   a housing;
   a circuit board mounted on the housing, comprising a control module and a heating element;
   a first magnetic component mounted on the circuit board, and electrically connected to the control module; and
   a heat dissipation assembly, comprising:
      a first heat dissipation component, comprising a first support rotatably mounted on the housing, a first heat-conducting board slidably mounted on the first support, an elastic component mounted on the first support, and a second magnetic component mounted on the first support;
      a second heat dissipation component, comprising a second support rotatably mounted on the housing and a second heat-conducting board slidably mounted on the second support; and
      a connecting assembly, movably connected to the first support and the second support;
   wherein when the first magnetic component is powered on by the control module, the first magnetic component attracts the second magnetic component to drive the first support toward the circuit board, and the first heat-conducting board and the second heat-conducting board are closed together to cover the heating element; and
   wherein when the first magnetic component is powered off by the control module, the elastic component pushes the first support away from the circuit board, and the first heat-conducting board and the second heat-conducting board separate from each other to expose the heating element.

2. The electronic device of claim 1, wherein the electronic device further comprises a temperature sensor electrically connected to the control module, the first magnetic component is an electromagnet, when the temperature sensor detects that a temperature of the heating element exceeds or falls below a set value, the control module powers on or off the first magnetic component.

3. The electronic device of claim 2, wherein the temperature sensor is mounted on the circuit board and is adjacent to the heating element.

4. The electronic device of claim 2, wherein the temperature sensor is integrated in the heating element.

5. The electronic device of claim 1, wherein the housing comprises a bottom shell and a top cover, the top cover defines a plurality of heat dissipation holes, the bottom shell comprises a supporting portion and a plurality of fixing portions, and an end of the elastic component away from the first support abuts the supporting portion.

6. The electronic device of claim 5, wherein the fixing portions are cylindrical protrusions protruding from two inner walls of the bottom shell, the supporting portion is a thin plate protruding from one of the two inner side walls of the bottom shell, and each of the fixing portions has a shaft hole.

7. The electronic device of claim 5, wherein the first support has two first rotating portions, two first sliding rails, two first stopping boards, a first stopping portion and a second stopping portion, and the first support is rotatably connected to the bottom shell by the engagement of the two first rotating portions and two of the fixing portions.

8. The electronic device of claim 7, wherein the first stopping portion and the second stopping portion are respectively disposed at one end of the two first sliding rails, the second magnetic component is mounted on the first stopping portion, and the elastic component is mounted on the second stopping portion.

9. The electronic device of claim 8, wherein the two first rotating portions are shafts, and disposed outside the first support away from the first stopping portion and the second stopping portion.

10. The electronic device of claim 7, wherein the second support comprises two second rotating portion, two second sliding rails, two second stopping board, a third stopping portion and a fourth stopping portion, and the second support is rotatably connected to the bottom shell by the engagement of the two second rotating portions and another two of the fixing portions.

11. The electronic device of claim 10, wherein the third stopping portion and the fourth stopping portion are respectively disposed at one end of the two second sliding rails, and the connecting assembly connects the first stopping portion and the third stopping portion.

12. The electronic device of claim 11, wherein the connecting assembly comprises a connecting component and two fasteners, the connecting component comprises socket holes, each of the two fasteners pass through a respective one of the two socket holes and fixed to a respective one of the first stopping portion and the third stopping portion, and the connecting component movably connects to the two fasteners through the socket holes.

13. The electronic device of claim 10, wherein the two second rotating portions are shafts, and disposed outside the second support away from the third stopping portion and the fourth stopping portion.

14. The electronic device of claim 10, wherein the heat dissipation assembly further comprises a plurality of first wheels mounted on the first heat-conducting board and a plurality of second wheels mounted on the second heat-conducting board, the first wheels abut the two first sliding rails, and the second wheels abut the two second sliding rails.

15. The electronic device of claim 14, wherein the first stopping boards are located above the two first sliding rails to limit the first heat-conducting board, and the second stopping boards are located above the two second sliding rails to limit the second heat-conducting board.

16. The electronic device of claim 1, wherein one end of the elastic component away from the first support abuts the circuit board.

17. The electronic device of claim 1, wherein the electronic device further comprises a heat sink, and the heat sink abuts the heating element.

* * * * *